United States Patent
De Rossi et al.

(10) Patent No.: US 7,622,703 B2
(45) Date of Patent: Nov. 24, 2009

(54) PHOTODETECTOR HAVING A NEAR FIELD CONCENTRATION

(75) Inventors: Alfredo De Rossi, Paris (FR); Mathieu Carras, Montrouge (FR); Philippe Bois, Cesson (FR)

(73) Assignee: Thales (FR)

( * ) Notice: Subject to any disclaimer, the term of this patent is extended or adjusted under 35 U.S.C. 154(b) by 668 days.

(21) Appl. No.: 10/582,796

(22) PCT Filed: Dec. 7, 2004

(86) PCT No.: PCT/EP2004/053324
§ 371 (c)(1),
(2), (4) Date: Jun. 14, 2006

(87) PCT Pub. No.: WO2005/069385
PCT Pub. Date: Jul. 28, 2005

(65) Prior Publication Data
US 2007/0085114 A1 Apr. 19, 2007

(30) Foreign Application Priority Data
Dec. 16, 2003 (FR) .................................. 03 14717

(51) Int. Cl.
*H01L 29/06* (2006.01)
(52) U.S. Cl. ...................... 250/214.1; 257/21
(58) Field of Classification Search ............. 250/214.1, 250/214 R, 338.4; 257/14, 21; 385/37
See application file for complete search history.

(56) References Cited
U.S. PATENT DOCUMENTS

| 5,086,327 | A | 2/1992 | Rosencher et al. |
| 5,187,715 | A | 2/1993 | Weisbuch et al. |
| 5,228,777 | A | 7/1993 | Rosencher et al. |
| 5,326,984 | A | 7/1994 | Rosencher et al. |
| 5,506,418 | A | 4/1996 | Bois et al. |
| 5,677,544 | A | 10/1997 | Duboz et al. |
| 5,726,500 | A | 3/1998 | Duboz et al. |
| 5,869,844 | A | 2/1999 | Rosencher et al. |
| 5,969,375 | A | 10/1999 | Micheron et al. |
| 6,091,126 | A | 7/2000 | Costard et al. |

(Continued)

OTHER PUBLICATIONS

Barnes, W. L., T. W. Presist, S. C. Kitson and J. R. Sambles, "Physical Origin of Photonic Energy Gaps in the Propagation of Surface Plasmons on Gratings", Physical Review B, vol. 54, pp. 6227-6224, 1996.

(Continued)

*Primary Examiner*—Seung C Sohn
(74) *Attorney, Agent, or Firm*—Lowe Hauptman Ham & Berner, LLP

(57) ABSTRACT

The field of the invention is that of photodetectors (10), and more precisely so-called quantum well photodetectors operating in the medium infrared, known by the acronym QWIP standing for Quantum Well Infrared Photodetector.

It is an object of the invention to increase the detectivity of the detectors by significantly reducing the surface area of the detection zone while conserving the incident flux. This result is obtained by arranging a structure (4) or grating on the active zone (31) of the photodetector (10), which couples the incident wave and confines it on the active zone (31).

The major features of this structure (4) or this grating are that it comprises patterns or grooves having a first spatial frequency and a second spatial frequency, and also comprising a central defect.

16 Claims, 15 Drawing Sheets

U.S. PATENT DOCUMENTS

| | | | |
|---|---|---|---|
| 6,157,020 A * | 12/2000 | Krapf et al. | 250/214 LA |
| 6,534,758 B2 | 3/2003 | Costard et al. | |
| 6,627,868 B2 * | 9/2003 | Bois et al. | 250/214.1 |
| 6,797,938 B2 * | 9/2004 | Bois et al. | 250/225 |
| 6,809,350 B1 | 10/2004 | Berger et al. | |
| 2005/0249473 A1 | 11/2005 | Page et al. | |
| 2006/0243892 A1 | 11/2006 | Bois et al. | |
| 2006/0289728 A1 | 12/2006 | Bois et al. | |

OTHER PUBLICATIONS

Dmitruk, N. L. et al., "Ultraviolet Responsivity Control in Schottky Barrier Heterostructures with Textured Interface", Thin Solid Films, Elsevier-Sequoia, S. A. Lausanne, CH, vol. 364, No. 1-2, Mar. 2000, pp. 280-283, XP004195111, ISSN: 0040-6090.

Pincemin, Francois and Jean-Jacques Greffet, "Propagation and Localization of a Surface Plasmon Polariton on a Finite Grating", Journal of the Optical Society of America B, vol. 13, pp. 1499-1509, 1996.

* cited by examiner

Section AA

Section BB

Section CC

Section DD

PHOTODETECTOR HAVING A NEAR FIELD CONCENTRATION

CROSS-REFERENCE TO RELATED APPLICATIONS

The present Application is based on International Application No. PCT/EP2004/053324, filed on Dec. 7, 2004, which in turn corresponds to FR 03/14717 filed on Dec. 16, 2003, and priority is hereby claimed under 35 USC §119 based on these applications. Each of these applications are hereby incorporated by reference in their entirety into the present application.

BACKGROUND OF THE INVENTION

1. Field of the Invention

The field of the invention is that of photodetectors, and more precisely so-called quantum well photodetectors operating in the medium infrared, known by the acronym QWIP standing for Quantum Well Infrared Photodetector.

2. Description of the Prior Art

In order to improve the performance of the detectors it is necessary to optimize their detectivity, i.e. the ratio between the response of the detector and the noise. When the electronic noise is negligible, the total noise is proportional to the square root of the area of the electrically active zone of the detector. The response, for its part, is proportional to the light flux absorbed. With a constant absorbed flux, it is therefore necessary to reduce the area of the absorption zone in order to improve the detectivity. Similarly, the dark current is proportional to the area of the active zone. In imaging systems in which the dark current limits the performance of the readout circuit, it is therefore also important to reduce the size of the area of the active zone in order to increase performance.

When a single detector is used, in order to reduce the area of the active zone while conserving the flux it is possible, for example, to focus the light onto a detector of size D using a lens with a diameter $\phi$ slightly greater than D, in which case an improvement of the signal/noise ratio by a quantity equal to $\sqrt{\phi/D}$ is obtained. The signal/dark current ratio is also improved by a factor $\phi/D$. This solution is not applicable per se to a matrix of detectors.

SUMMARY OF THE INVENTION

It is an object of the invention to concentrate the light energy on a reduced surface of the detector by exploiting near field localization phenomena and the properties of certain surface waves known as surface plasmons, the localization being obtained by means of optical structures arranged in the vicinity of the active surface of the detector. The detectivity of the detector is thus improved significantly.

The invention advantageously applies to quantum well detectors. This is because these detectors naturally require a diffraction grating which excites a polarized wave of the Transverse Magnetic type, making it possible for the incident wave to be absorbed by the quantum wells. In this case, it is sufficient to modify the structure of the grating in order to obtain both absorption and concentration of the incident light energy.

This invention, which utilizes metallic gratings, is well suited to the infrared range. This is because the metallic structures are particularly efficient in this spectral range, in so far as they exhibit both low losses and a strong interaction with the electromagnetic field.

Lastly, the field may be concentrated either in one space dimension by means of a structure composed of parallel grooves, or in both space dimensions by means of a two-dimensional structure.

More precisely, the invention relates to a photodetector comprising at least one active zone for detecting optical radiation and a structure, arranged on said active zone, intended for optically coupling the optical radiation, characterized in that the active zone has an elongate shape and said structure is composed of grooves which are mutually parallel and parallel to the length of the active zone.

Advantageously, the structure is produced in a layer of at least one dielectric material which is transparent in the spectral range of the optical radiation, said layer comprising a substantially plane lower face in contact with the active zone and an upper face comprising the grooves of the structure, said face being covered with a metal film, and the optical thickness of said layer separating the lower face from the upper face along an axis perpendicular to the direction of the grooves and parallel to the plane of the lower face varying as the superposition of at least one first so-called coupling grating whose pitch has a first spatial frequency and a second so-called localization grating whose pitch has a second spatial frequency that is two times the first spatial frequency and which comprises a central spatial defect.

It also relates to a photodetector comprising at least one active zone for detecting optical radiation and a structure, arranged on said active zone, intended for optically coupling the optical radiation, characterized in that said two-dimensional structure is composed of patterns with substantially identical dimensions, in that the active zone is centered on said structure and in that the dimensions of the active zone are substantially equal to the average dimensions of the patterns. Advantageously, when the layer constituting the structure is made from an isotropic dielectric material, each pattern is composed of mutually parallel plane facets with different heights, the dimensions of the patterns of the structure being approximately equal to half the average wavelength of the incident radiation divided by the average optical index of the structure and the active zone being surrounded by an optically passive zone with dimensions substantially equal to those of the structure. Advantageously, the structure is produced in a layer of at least one dielectric material which is transparent in the spectral range of the optical radiation, said layer comprising a substantially plane lower face in contact with the active zone and an upper face comprising the patterns of the structure, said face being covered with a metal film, the optical thickness of said layer separating the lower face from the upper face varying:

along a first axis parallel to the plane of the lower face, as at least one first grating whose pitch has a first spatial frequency;

along a second axis perpendicular to the first axis and parallel to the plane of the lower face, as at least one second grating whose pitch has the same first spatial frequency; and along an oblique third optical axis at 45 degrees to the previous two, as at least one third grating whose pitch has a second spatial frequency equal to half the first spatial frequency.

BRIEF DESCRIPTION OF THE DRAWINGS

The invention will be understood more clearly, and other advantages will become apparent, on reading the following description given without implying any limitation and from the appended figures, in which.

MORE DETAILED DESCRIPTION

The invention is based on the properties of surface plasmons in interaction with optical diffraction structures or gratings.

A surface plasmon is a surface wave propagating at the interface between two media whose dielectric permittivities are of opposite sign, the sum of the permittivities itself being negative. This is the case, for example, with interfaces between a conductive medium, which may be a metal or a doped semiconductor material, and a dielectric medium. It can be shown that surface plasmons exist below the resonant frequency of the plasma. An optical wave is conventionally defined by the propagation of an electromagnetic field, characterized by an angular frequency $\omega$ characteristic of its temporal variation and a wave vector k characteristic of its spatial variation. It can be shown that the angular frequency and the wave vector of a wave capable of propagating at the interface between two media of this type satisfy one of the two curves in FIG. 1, where $\omega_p$ respectively represents the plasma frequency and where $k_p$ is equal to $\omega_p/c$, c being the speed of light. It can be shown that surface plasmons exist only below the resonant frequency of the plasma, and consequently only the lower curve is representative of surface plasmons.

Figure 2:
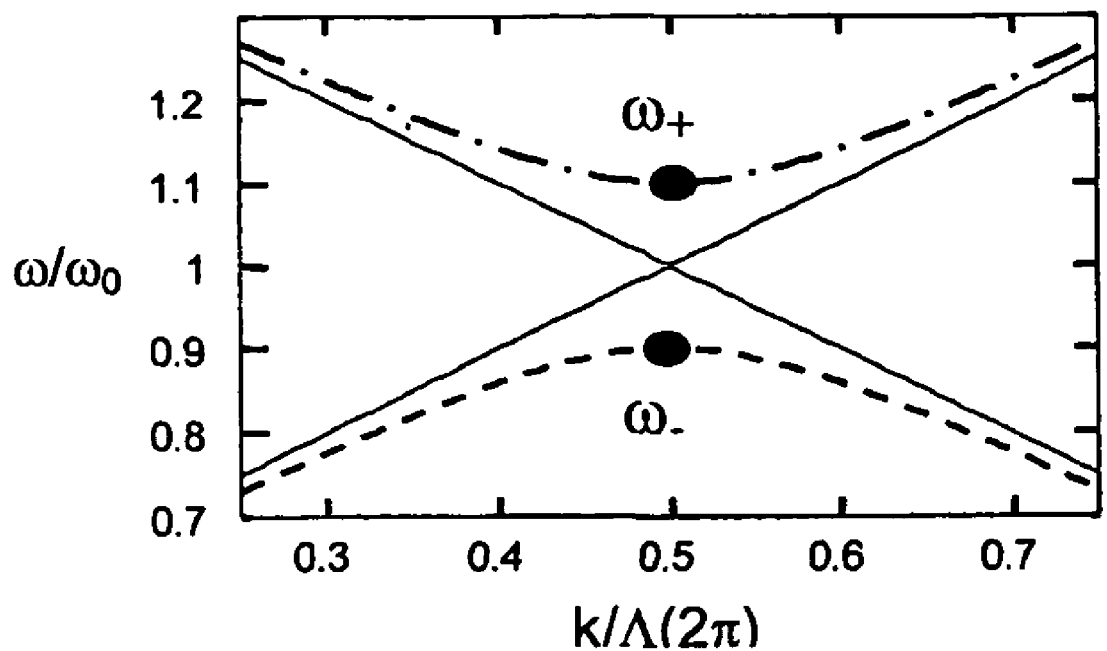
FIG. 2 represents the dispersion curve of the waves propagating in a periodic medium.
Figure 3:
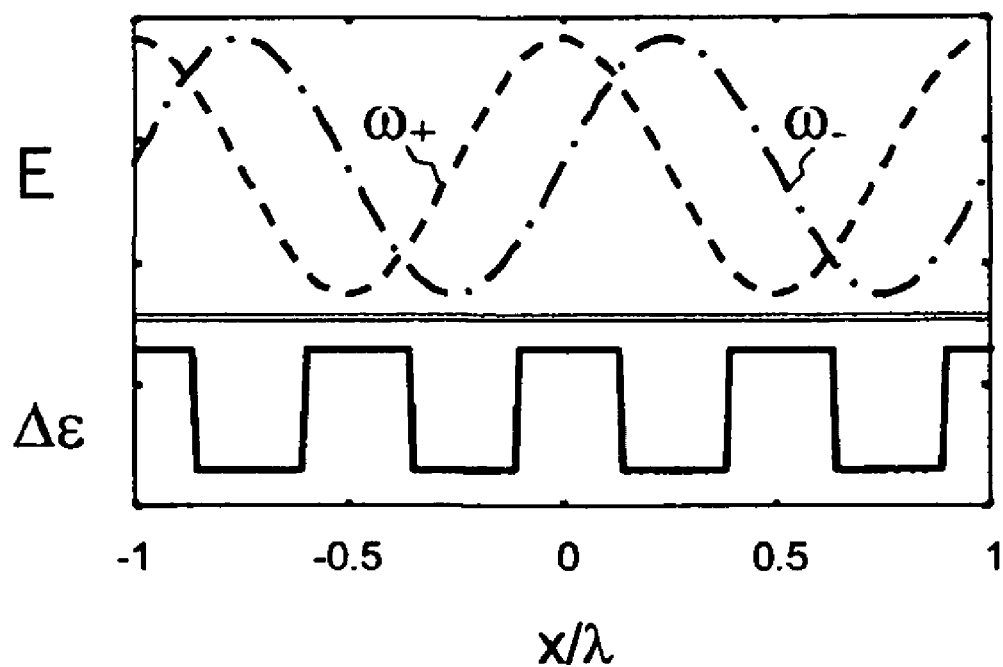
FIG. 3 represents the distribution of the electric field and of the permittivity profile corresponding to the points $\omega_-$ and $\omega_+$ in FIG. 2.

In media where the refractive index is modulated periodically it can be shown that there are spectral ranges in which light cannot propagate, which are referred to as "photonic forbidden bands". For example, FIG. 2 represents a forbidden band in the case of a periodic medium of pitch $\Lambda$ whose index variation is characterized by modulation of the dielectric constant $\Delta\in(x)$ having the value $\Delta\in \cos(2\pi x/\Lambda)$ in a direction x perpendicular to the grooves of the grating in FIG. 2. The abscissa in FIG. 2 represents the wave vectors k normalized with respect to the pitch $\Lambda$ of the periodic grating. The ordinate represents the angular frequency $\omega_o$ normalized with respect to an angular frequency of value $c/2\Lambda$. The forbidden band lies between the lower branch and the upper branch in FIG. 2. It is centered at $\omega_o$ and at $k_o$ equal to $\Lambda/2$. The angular frequencies corresponding to $k_o$, taken at the forbidden band limit, are denoted as $\omega_+$ and $\omega_-$. We put $\omega_-$ equal to $\omega_0-\Delta\omega$ and $\omega_+$ equal to $\omega_0+\Delta\omega$. The minimum width $\Delta\omega$ corresponding to the difference between $\omega_+$ and $\omega_-$ has the value $c\Delta\in/2\Lambda \sqrt{\in}$. Outside the forbidden bands, the electromagnetic waves which propagate are referred to as "Bloch" waves and are the product of a strictly periodic term and a phase term whose wave vector $\delta$ vanishes at the edge of the forbidden band. In the case of FIG. 2, the distributions of the fields $E_+$ and $E_-$ corresponding to the angular frequencies $\omega_+$ and $\omega_-$ are proportional respectively to $\sin(\pi x/\Lambda)e^{\pm i\delta x}$ and $\cos(\pi x/\Lambda)e^{\pm i\delta x}$. Said distributions of $E_+$ and $E_-$ are represented in FIG. 3 as a function of the parameter $x/\lambda$, the variation of the dielectric constant also being represented in this same figure.

The surface plasmons also satisfy these properties when the medium in which they propagate is modulated periodically. They then assume the properties of Bloch waves. The plasmon propagates along the interface between the dielectric and the metal. The optical index can be modulated in two ways. The first consists in periodically varying the permittivity of the dielectric medium. The second consists in producing a metal/dielectric interface in the form of a grating. In particular, it can be shown that a grating whose profile h(x) follows the law $h_0 \cos(2\pi x/\Lambda)$, $h_o$ being a constant, is equivalent to a modulation of the dielectric permittivity $\Delta\in(x)$ equal to $\Delta\in \cos(2\pi x/\Lambda)$ (W. L. Barnes, T. W. Presist, S. C. Kitson, and J. R. Sambles, "Physical Origin of photonic energy gaps in the propagation of surface plasmons on gratings," *Physical Review B*, vol. 54, pp. 6227-6244, 1996.).

In a grating of finite size, there are resonances of the Fabry-Pérot type due to the reflection of plasmons at the ends of the grating. The distribution of the field, however, is different from that of a Fabry-Pérot cavity in a homogeneous medium. Let L be the length of the grating and δ a parameter with the value (k−π/Λ), then the resonance condition is written:

δL=pπ, p being an integer

Figure 4:
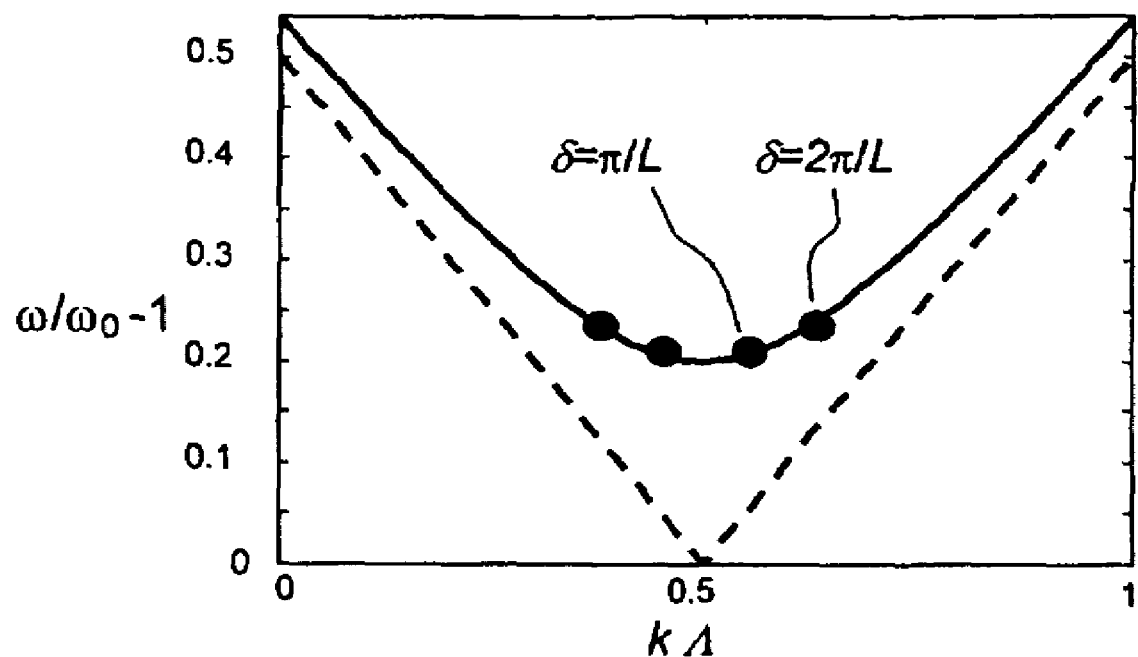
FIG. 4 represents the dispersion curve of the waves propagating in a periodic medium of length L.
Figure 5:
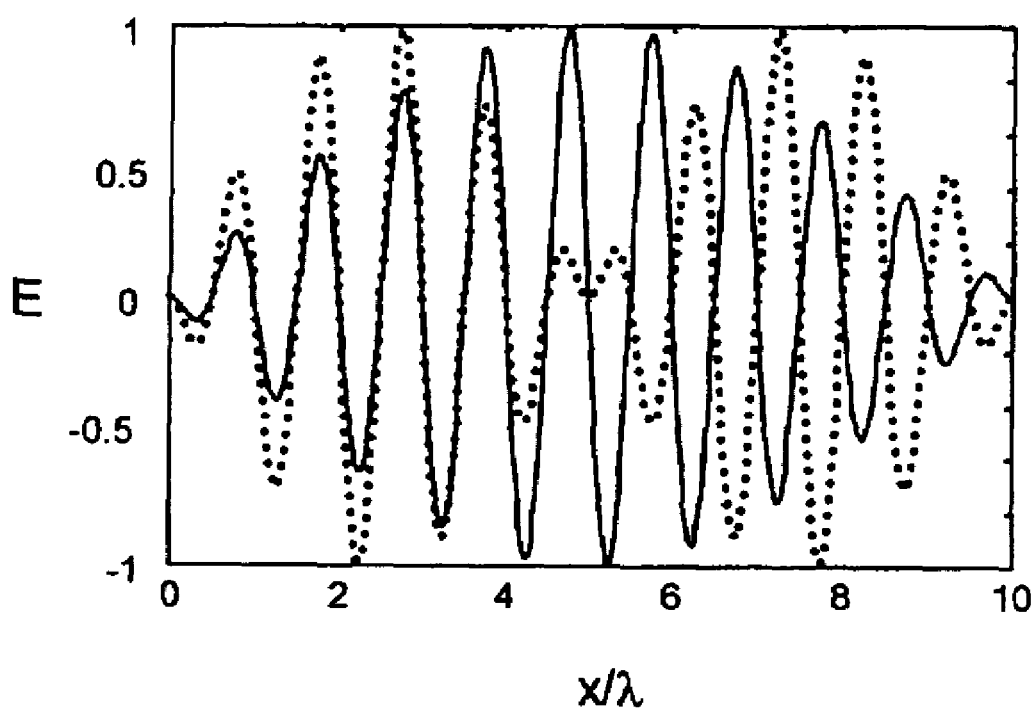
FIG. 5 represents the distribution of the electric field for the first order ($\delta=\pi/L$) and the second order ($\delta=2\pi/L$) of the modes represented in FIG. 4.

This condition can be satisfied starting from p equal to 1, even if the length L of the grating is very much greater than the wavelength λ of the plasmon wave. FIG. 4 represents the dispersion curve of the surface plasmons for a grating of the Fabry-Pérot type, in the particular case in which L is equal to 10 times the wavelength. In this FIG. 4, the parameter kΛ is on the abscissa and the parameter $(\omega/\omega_o-1)$ is on the ordinate. The black points correspond to the values of kΛ and $(\omega/\omega_o-1)$ for different values of p. When p is equal to 1, the field E is localized in the middle of the grating as indicated in FIG. 5. In this case the field E for $\omega_+=\omega_0+\Delta\omega$ is equal to $E_+$ and is proportional to $\sin(\pi x/\Lambda)\sin(\delta x)$, and for $\omega_-=\omega_0-\Delta\omega$ it is E and is proportional to $\cos(\pi x/\Lambda)\sin(\delta x)$. This phenomenon is predicted for surface plasmons in metallic gratings (F. Pincemin and J.-J. Greffet, "Propagation and localization of a surface plasmon polariton on a finite grating," *Journal of the Optical Society of America B*, vol. 13, pp. 1499-1509, 1996). In FIG. 5, the field E in the case in which p is equal to 2 has also been in represented by dots.

When a periodic structure is perturbed, for example by introducing a defect which may for example be a phase shift or a local change in refractive index, then a localized mode appears around the defect. The energy of this level then lies in the forbidden band. For example, let there be a modulation of the index described by its permittivity variation: $\Delta\in(x)=\Delta\in \cos(2\pi(|x|-\Delta x)/\Lambda)=\pm\Delta\in \sin(2\pi|x|/\Lambda)$, while adopting the same conventions as previously. In the limit that $\Delta\in(x)$ is a perturbation, the field of the localized mode can be written in the following way:

$$E(x) = \begin{cases} e^{-\gamma x}\cos(k(x-\Delta x/2)-\pi/4) & x>0 \\ e^{\gamma x}\cos(k(x+\Delta x/2)+\pi/4) & x<0 \end{cases}$$

where $k=2\pi n/\lambda=\pi/\Lambda$. The phase shift Δx can take two values: ±Λ/8=±λ/4n to within a multiple of Λ/4, n being the refractive index of the grating.

Figure 6:
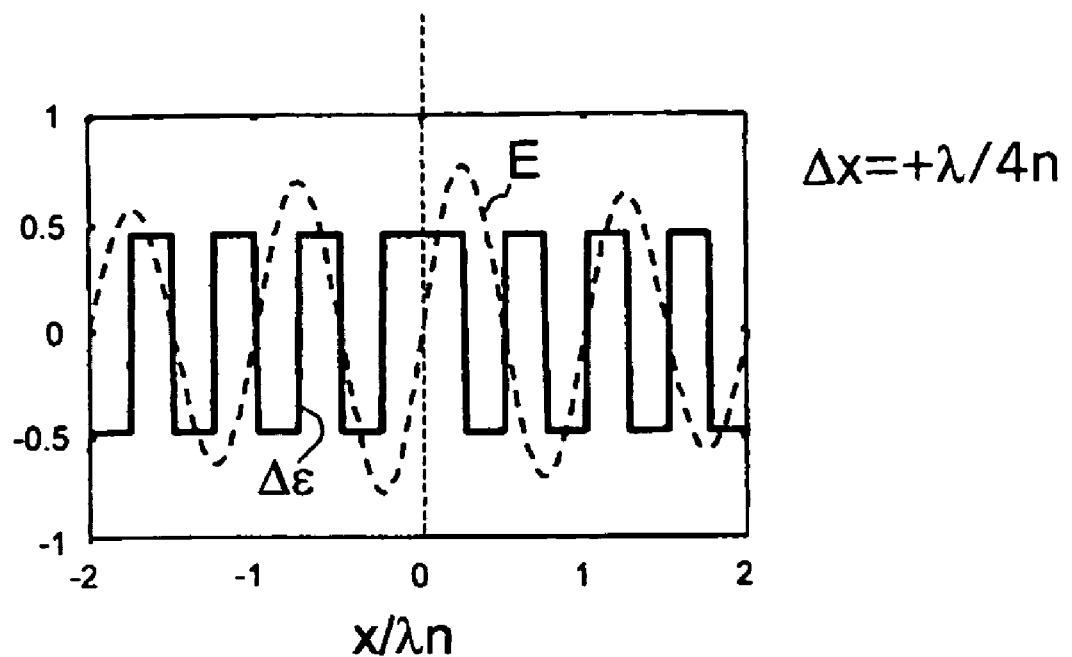
FIG. 6 represents the distribution of the electric field and the permittivity profile in the case of a periodic medium comprising a defect $\Delta x$ equal to $+\lambda/4$.
Figure 7:
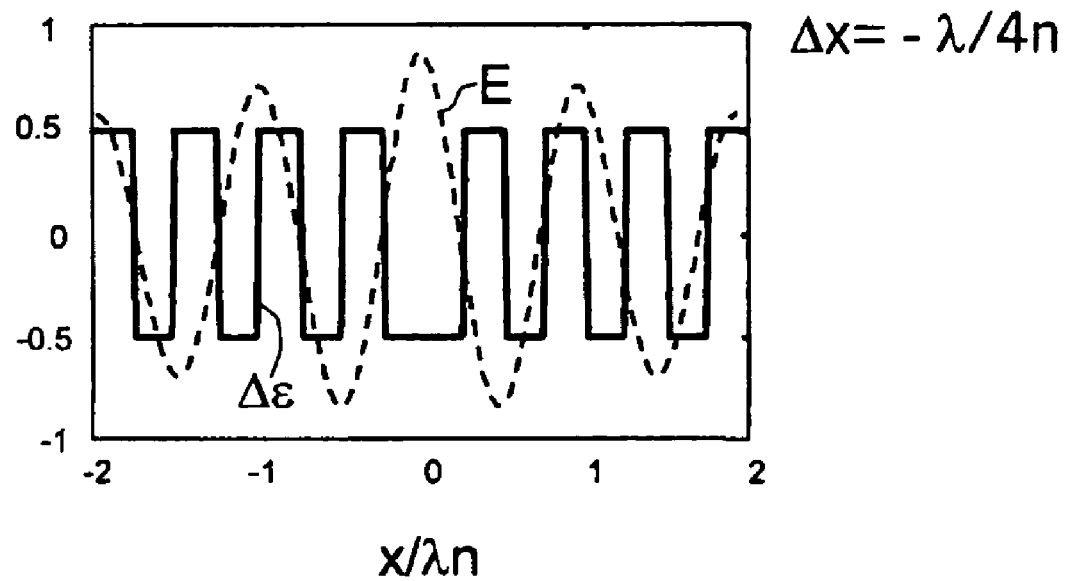
FIG. 7 represents the distribution of the electric field and the permittivity profile in the case of a periodic medium comprising a defect $\Delta x$ equal to $-\lambda/4$.

The decrease of the field is linked with the term γ equal to $k\Delta\in/4\sqrt{\in}$. It can be shown that the distribution of the field preserves the symmetry properties. Furthermore, the positions of the extrema of the field E with respect to the grating do not change. FIGS. 6 and 7 represent the distribution of the field E in dashes and, in solid lines, the profile of the permittivity variation as a function of the direction x perpendicular to the direction of the grooves of the grating for two values of the phase shift, which are respectively equal to +λ/4n and −λ/4n.

Figure 1:
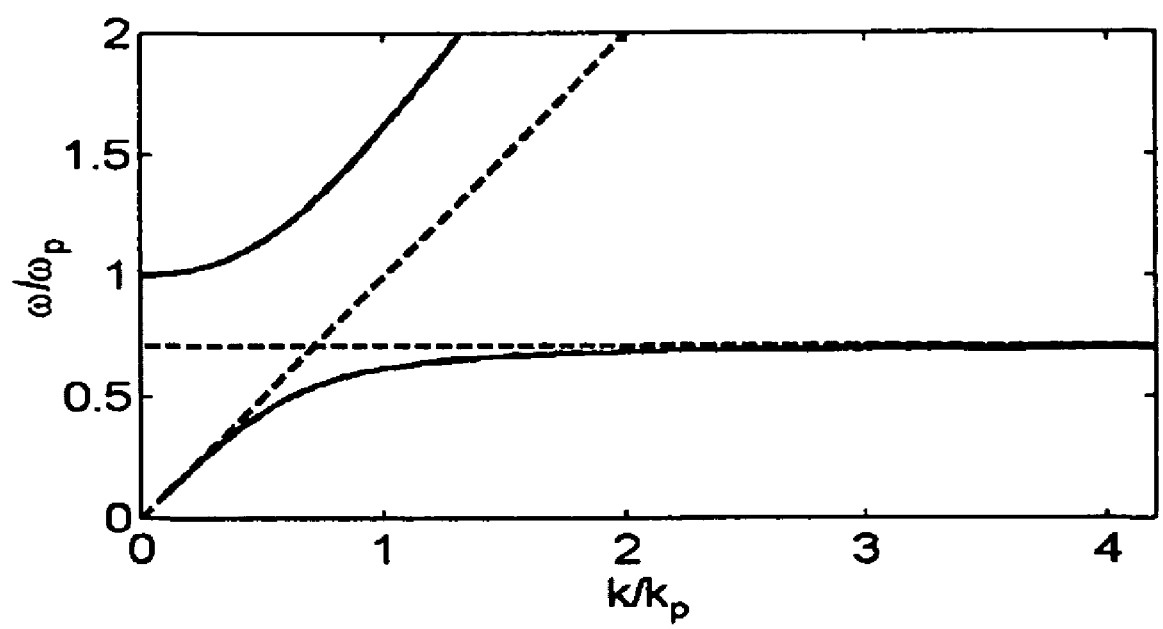
FIG. 1 represents the dispersion curve of the surface plasmons in the case of interference between two media with different permittivities.

The surface plasmons lie below the "light line", as can be seen in FIG. 1 where it is shown by the diagonal in dashes, and they cannot be excited without the aid of the prism or a coupling grating. The properties of the surface plasmons which are excited by a metallic coupling grating $k_1$ equal to $2\pi/\Lambda_1$, $\Lambda_1$ being the pitch of the grating, and which interact with a Bragg grating $k_2$ equal to π/Λ$_2$ have been studied. (W. L. Barnes, T. W. Presist, S. C. Kitson, and J. R. Sambles, "Physical Origin of photonic energy gaps in the propagation of surface plasmons on gratings," *Physical Review B*, vol. 54, pp. 6227-6244, 1996.). In this case, limiting ourselves to the first order terms in the Fourier series corresponding to the profile of the grating, the profile h(x) of the grating is:

$h(x)=a_1 \cos(2\pi x/\Lambda_1)+a_2 \cos(2\pi x/\Lambda_2+\Phi)$.

In a metallic grating, it is the surface charge generated by the incident wave which becomes the source of the excited surface wave. We then find that the charge $\sigma_s(x)$ is proportional to $a_1 \sin(2\pi x/\Lambda_1)$. Since the coupling depends on the superposition between the charge and the Bloch mode, the relative phase φ determines the excited branch allowing the Bloch modes to propagate, as indicated in FIG. 2. If φ is equal to π, the lower branch ω⁻ is excited; if φ is zero, the branch ω⁺ is excited.

By combining the properties of coupling gratings and Bragg gratings having at least one defect it is therefore possible to obtain, from an incident wave, a plasmon wave which is both coupled and localized in a region having dimensions which are small compared to those of the final structure, and consequently to improve significantly the detectivity of a detector comprising such a structure. This provision may be applied to structures of the one-dimensional type, i.e. ones whose profile varies only in one direction in space, in which case the wave is localized in a narrow central band parallel to the direction of the grooves. It also applies to structures of the two-dimensional type, i.e. ones whose profile varies in both space dimensions, in which case the wave is localized at the center of the grating in a zone having dimensions which are narrow compared to the dimensions of the grating.

Case of Photodetectors with a One-Dimensional Grating

Figure 8:
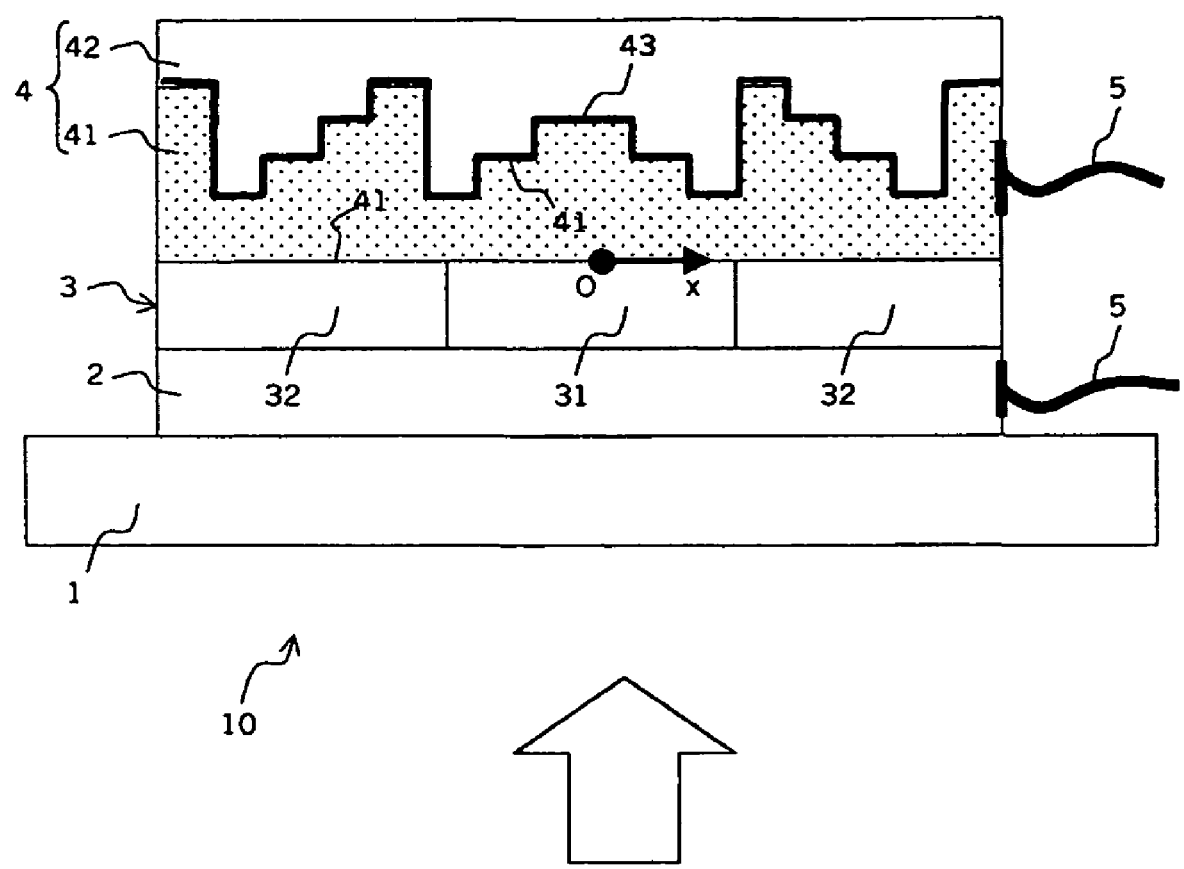
FIG. 8 represents a view in section of a detector comprising a grooved structure according to the invention.

In this case, as indicated in FIG. 8, a photodetector 10 according to the invention essentially comprises:

A first photodetector support substrate 1, which is transparent to the optical radiation intended to be detected;

A conductive first layer 2, which is likewise transparent;

A second layer 3 composed of the active zone 31 proper, which has the form of a narrow band, and two peripheral zones 32 which are inactive to light and arranged on either side of the active zone, at least the inactive zones likewise being transparent;

The structure 4 according to the invention;

Electrical contact zones 5 making it possible to pick up the electrical signal coming from the active zone.

As illustrated in the FIG. 8, the structure 4 according to the invention essentially comprises a layer 41 of at least one dielectric material which is transparent in the spectral range of the optical radiation, said layer 41 comprising a substantially plane lower face 410 in contact with the active zone and an upper face 411 comprising the grooves of the structure, said face being covered with a metal film 43 represented by bold lines in FIG. 8. For example, without implying any limitation, the metal is gold or palladium. The thickness of said metal layer is a few nanometers. The optical thickness of said layer separating the lower face from the upper face varies, along an axis Ox perpendicular to the direction of the grooves and parallel to the plane of the lower face, as the superposition of at least one first grating whose pitch has a first spatial frequency and a second grating whose pitch has a second spatial frequency that is two times the first spatial frequency. A second layer of dielectric material 42 protects the structure.

The photodetector functions as follows. A light beam (thick arrow in FIG. 8) illuminates the photodetector with close to normal incidence. This beam passes through the first substrate 1, the conductive first layer 2 and the second layer 3 without substantial attenuation. It then reaches the structure 4. As mentioned, the structure is the combination of a coupling grating whose purpose is to excite a surface wave in transverse magnetic polarization, i.e. one whose electric field is perpendicular to the grating, with a Bragg grating having a defect in order to obtain localization of the light beam captured by the structure in a central zone corresponding to the active zone 31. This improves the signal-to-noise ratio, which is the intended object.

If we define an axis Ox perpendicular to the direction of the grooves and parallel to the plane of the lower face of the grating 4 then, to within a constant, the mathematical function defining the optical thickness R(x) of the structure is the sum of the two periodic functions g(x,Λ) and f(x,2Λ), f representing the coupling function with spatial period Λ and g representing the localization Bragg function with spatial period 2Λ comprising a central defect. The relative phase between f and g conditions the final confinement properties of the coupled wave. If λ denotes the average wavelength of the incident radiation, then the pitch Λ should advantageously be approximately equal to λ/2n in order to obtain optimal coupling of the incident wave.

It can be shown that there are two families of possible structure profiles, one exciting an anti-symmetric mode and the other a symmetric mode.

In the case of the anti-symmetric mode, the functions $f_{AS}$ and $g_{AS}$ are then of the form:

$$f_{AS}(x) = \pm a_1 \cos(2\pi x/\Lambda)$$

$$g_{AS}(x) = -a_2 \cos(4\pi |x|/\Lambda - \pi/2)$$

$a_1$ and $a_2$ being two positive constants.

In other words, to within a constant, the thickness R(x) varies along an axis perpendicular to the direction of the grooves and parallel to the plane of the lower face, whose origin is centered on the center of the grating, as a function which is the sum or the difference of:

a first function which is proportional to the sign function of the cosine function of the distance from the origin of said axis and has a period equal to that of the pitch of the grooves; and a second function which is proportional to the sign function of the cosine function of the absolute value of the distance from the origin of said axis and has a period equal to half that of the pitch of the grooves, said second function being phase-shifted by one half-period with respect to the first function.

Advantageously, the proportionality coefficient of the first function is two times that of the second function and the pitch of the first grating of the structure is approximately equal to half the average wavelength of the incident radiation divided by the average optical index of the structure.

In this case, it can be shown that the complex amplitude E(x) of the coupled wave has the value $e^{-\gamma|x|} \sin(2\pi x/\lambda)$ corresponding to a localized mode. γ is a field decay constant depending on the parameters of the grating. The electric field E(x) and the profile $R_M$ of the one-dimensional structure in this anti-symmetric embodiment are represented as a function of x/Λ for $a_2$ equal to half $a_1$ in FIG. 9.

In the case of the symmetric mode, the functions $f_S$ and $g_S$ are then of the form:

$$f_S(x) = \pm a_1 \sin(2\pi x/\Lambda)$$

$$g_S(x) = a_2 \cos(4\pi |x|/\Lambda - \pi/2)$$

$a_1$ and $a_2$ being two positive constants.

In other words, the optical thickness of the layer separating the lower face from the upper face varies along an axis perpendicular to the direction of the grooves and parallel to the plane of the lower face, whose origin is centered on the center of the grating, as a function which is the sum or the difference of:

a first function which is proportional to the sign function of the sine function of the distance from the origin of said axis and has a period equal to that of the pitch of the grooves; and a second function which is proportional to the sign function of the cosine function of the absolute value of the distance from the origin of said axis and has a period equal to half that of the pitch of the grooves, said second function being phase-shifted by one half-period with respect to the first function.

Figure 10:
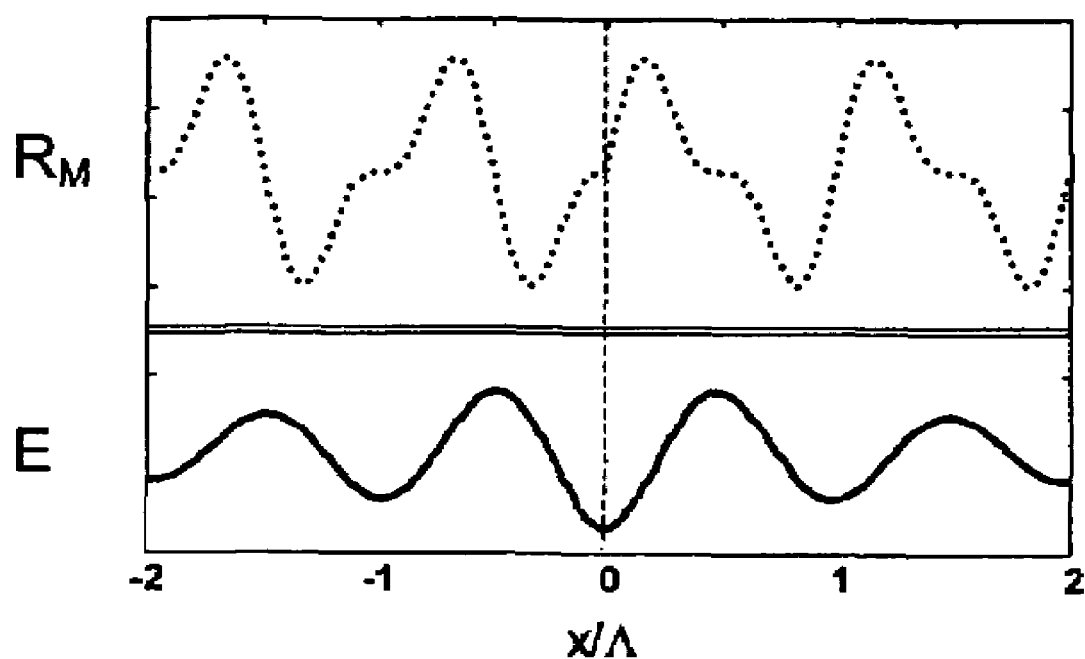
FIG. 10 represents the distribution of the electric field and the permittivity profile of the grooved structure in a second embodiment according to the invention.

In this case, it can be shown that the complex amplitude E(x) of the coupled wave has the value $e^{-\gamma|x|} \cos(2\pi x/\lambda)$ corresponding to a localized mode. γ is a field decay constant depending on the parameters of the grating. The electric field E(x) and the profile $R_M$ of the one-dimensional structure in this anti-symmetric embodiment are represented as a function of x/Λ for $a_2$ equal to half $a_1$ in FIG. 10. The choice of the respective weighting of the functions f and g is determined by the near field optimization, which depends on the application envisaged. There is no specific restriction on the coupling depth, nor on the relative weighting of the two functions.

Figure 9:
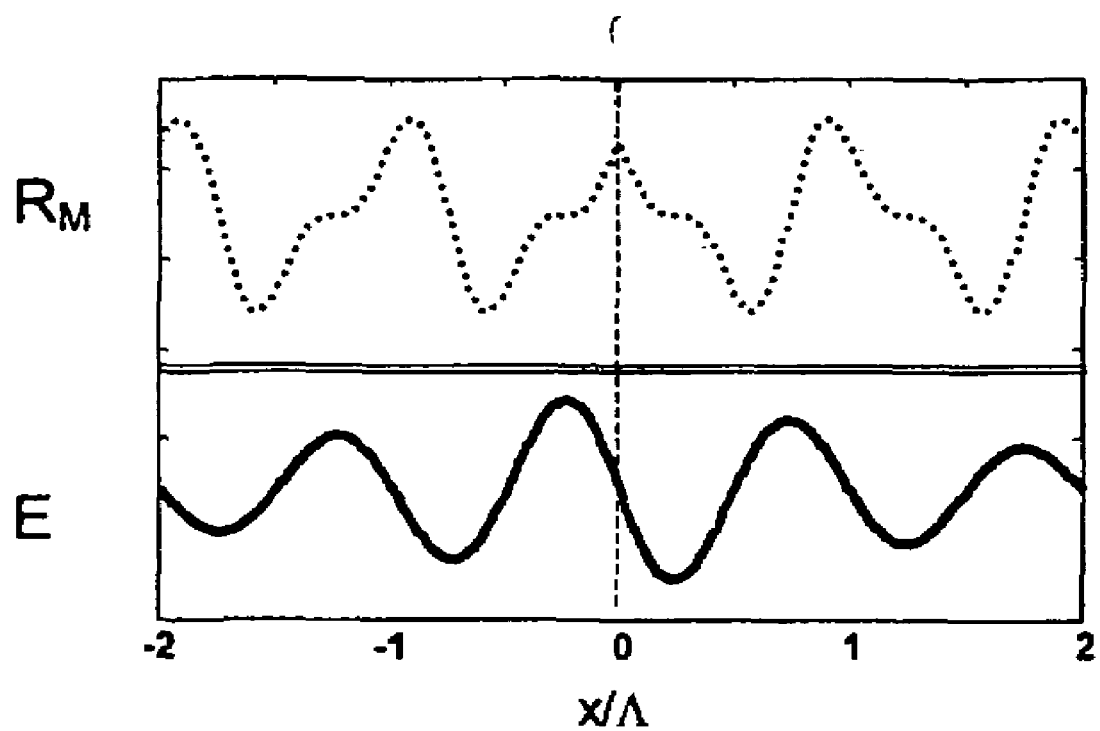
FIG. 9 represents the distribution of the electric field and the permittivity profile of the grooved structure in a first embodiment according to the invention.
Figure 11:
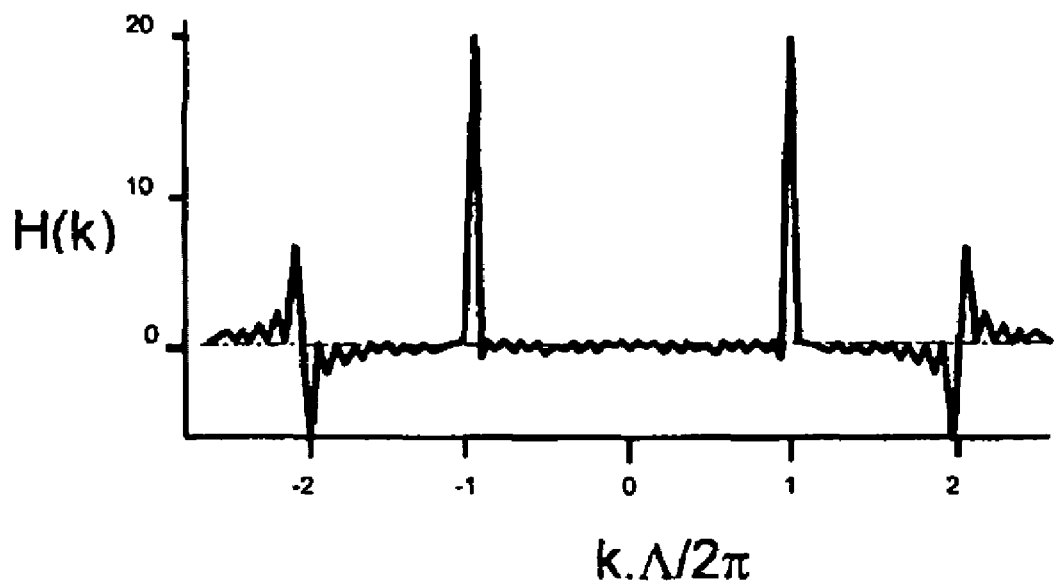
FIG. 11 represents the Fourier transform of the profile of the structure in the first embodiment according to the invention.
Figure 12:
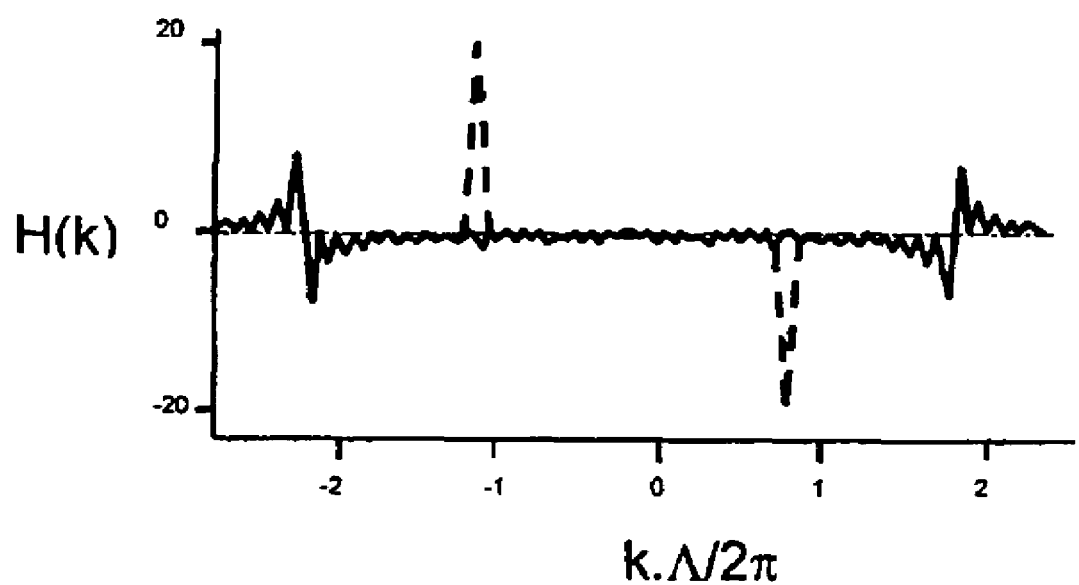
FIG. 12 represents the Fourier transform of the profile of the structure in the second embodiment according to the invention.
Figure 13:
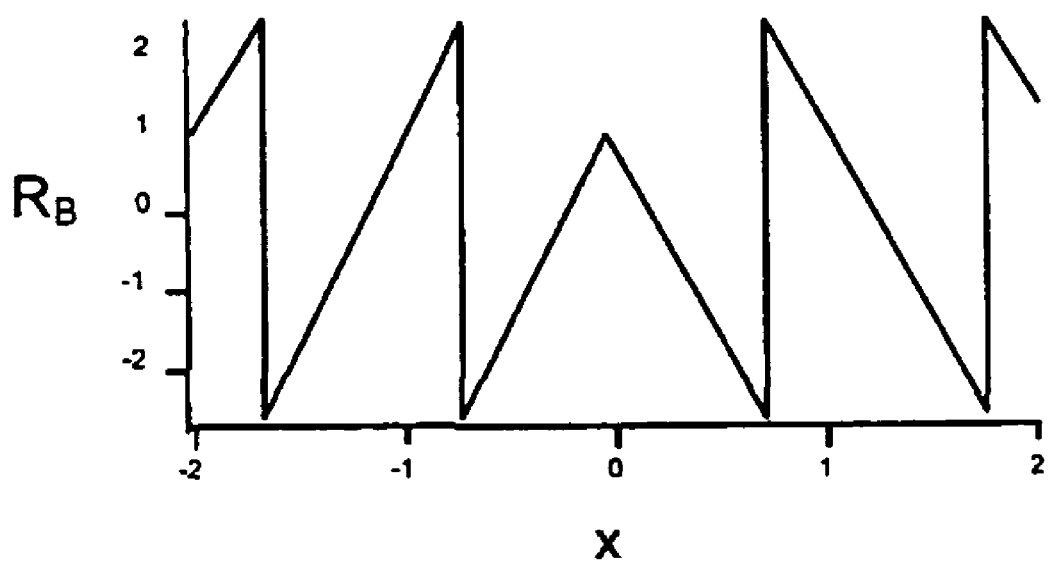
FIGS. 13 and 14 represent a structure profile in a third embodiment according to the invention, and its Fourier transform.
Figure 14:
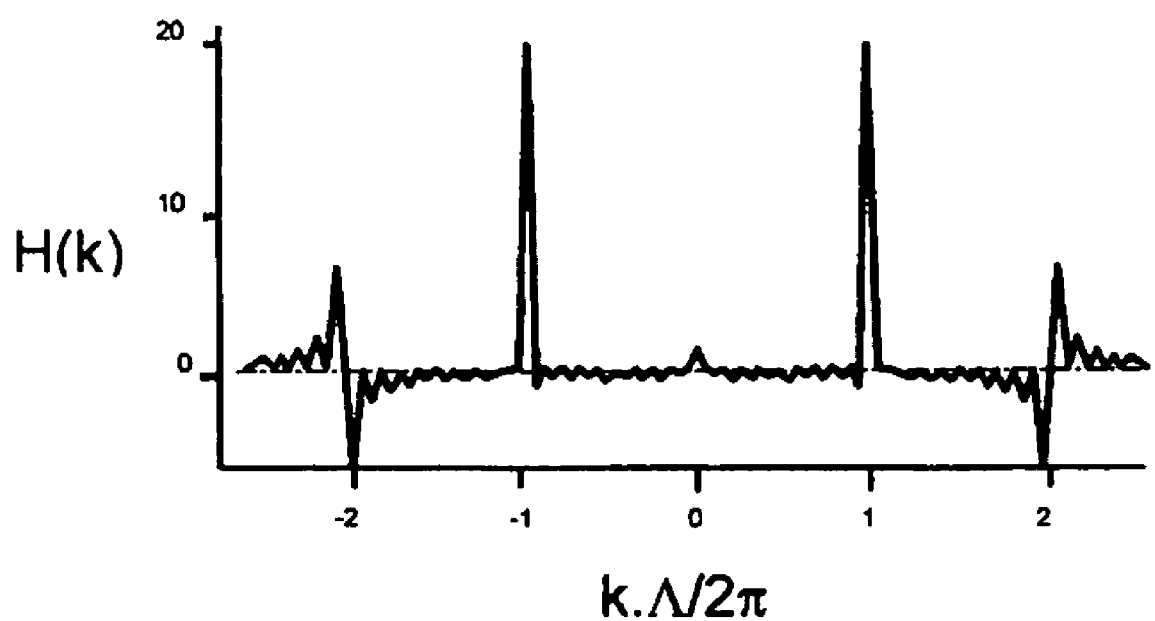

Technologically, the coupling gratings used in infrared detectors are produced by etching the layer then metal deposition. The technical production of structure profiles according to continuous functions such as f and g poses complex production problems, without offering significant advantages in terms of luminous efficiency. The coupling and localization properties of the structure are determined by the Fourier transform of the function representing the optical thickness of the structure for a value of k lying in the interval [−4π/Λ, +4π/Λ]. FIGS. 11 and 12 represent the Fourier transforms H(k) as a function of kΛ/2π for the anti-symmetric and symmetric modes as defined above. The solid curves represent the real parts of the Fourier transforms, and the dashed curves represented the imaginary parts of said Fourier transforms. In the case of the anti-symmetric mode in FIG. 11, two real and symmetric peaks are obtained in the vicinity of the values of kΛ/2π equal to +1 and −1 and two double peaks symmetric with respect to the origin, each being anti-symmetric and real, are obtained in the vicinity of the values of kΛ/2π equal to +2 and −2. In the case of the symmetric mode in FIG. 12, two pure imaginary peaks of opposite sign are obtained in the vicinity of the values of kΛ/2π equal to +1 and −1 and two real double peaks are obtained in the vicinity of the values of kΛ/2π equal to +2 and −2. If a profile very different from the sinusoidal profiles but comprising the same fundamental frequencies is chosen, then the fundamental coupling and localization functions are ensured. In the FIGS. 13 and 14, a structure profile $R_B$ of the "blazed" type is represented with its Fourier transform. Blazed gratings are used to maximize the diffraction of light waves in a single order, and generally have a characteristic sawtooth profile. It will be noted that the Fourier transform represented in FIG. 14 is very similar to the Fourier transform represented in FIG. 11. From this, it can be deduced that the coupling and confinement properties of this profile are equivalent to those of the one-dimensional structure exciting the anti-symmetric mode as represented in FIG. 9, even though the initial profiles are substantially different.

Technologically, the structures that are simple to produce consist of "staircase steps" or facets obtained by stacking successive layers. It is thus possible to obtain the desired profile in two or three etching steps. This type of profile has properties equivalent to those of the sinusoidal gratings, on the condition of course that it comprises two fundamental spatial frequencies, one being two times the other. Mathematically, in order to obtain this type profile, the functions f and g may be replaced by the functions sign(f) and sign(g) which satisfy the following properties:

when the function is positive, the function sign has the value +1 when it is negative, it has the value −1.

Figure 15:
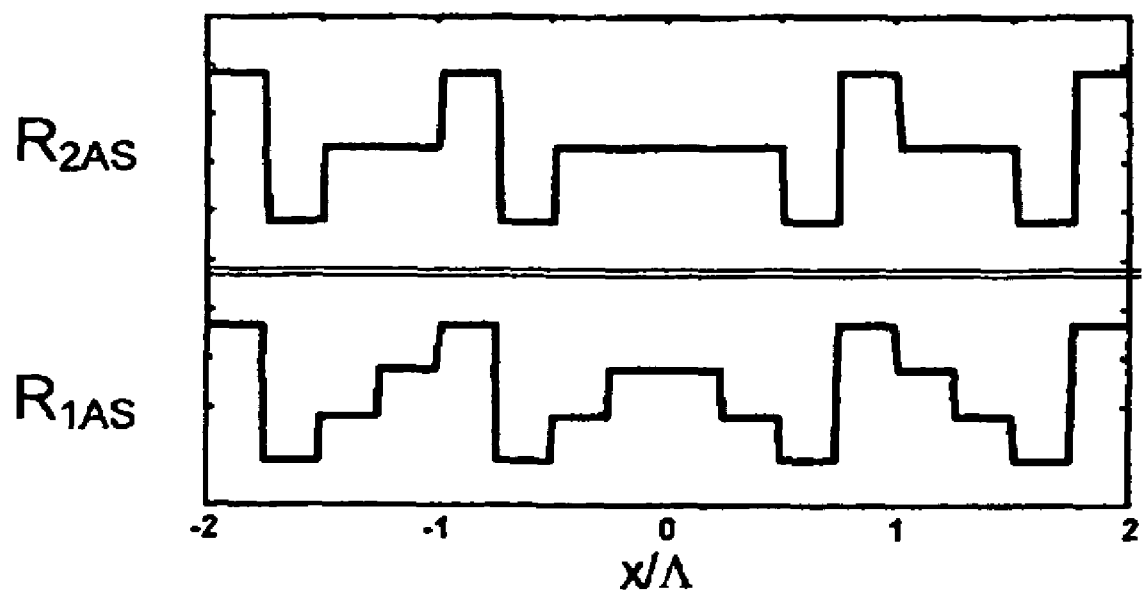
FIG. 15 represents two-real profiles of the grooved structure in said first embodiment according to the invention.
Figure 16:
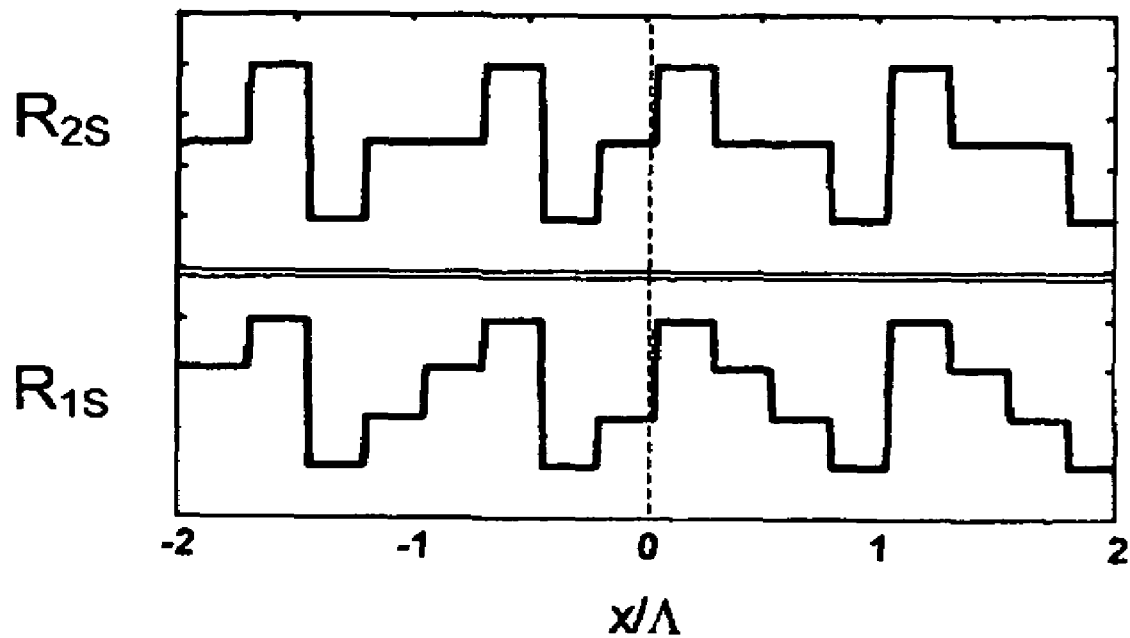
FIG. 16 represents two real profiles of the grooved structure in said second embodiment according to the invention.

Thus, FIGS. 15 and 16 represent the following profiles for the anti-symmetric and symmetric modes:

$$R_{1AS}(x) = \text{sign}(f_{AS}) + \text{sign}\left(\frac{g_{AS}}{2}\right)$$

$$R_{2AS}(x) = \frac{\text{sign}(f_{AS}) + \text{sign}(g_{AS})}{2}$$

$$R_{1S}(x) = \text{sign}(f_S) + \text{sign}\left(\frac{g_S}{2}\right)$$

$$R_{2S}(x) = \frac{\text{sign}(f_s) + \text{sign}(g_S)}{2}$$

This type of structure can be technologically produced in two different ways.

Figure 17:
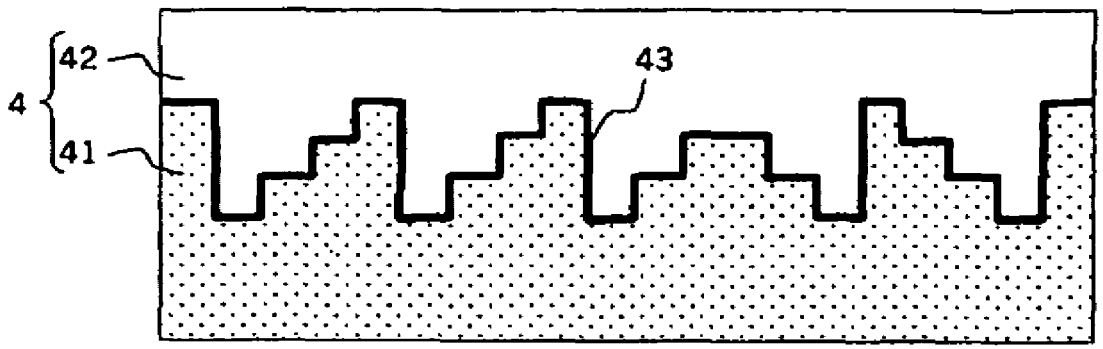
FIG. 17 represents a view in section of the grooved structure according to the first embodiment according to the invention.
Figure 17:
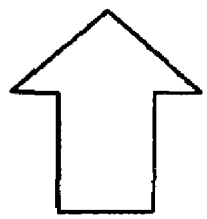

In a first embodiment, illustrated in FIG. 17, the layer 41 constituting the structure is made from an isotropic dielectric material, the profile of each groove along the axis perpendicular to the direction of the groups being composed of mutually parallel plane facets with different heights according to a profile of the same type as those in FIGS. 15 and 16. It has a protective layer 42 on top.

Figure 18:
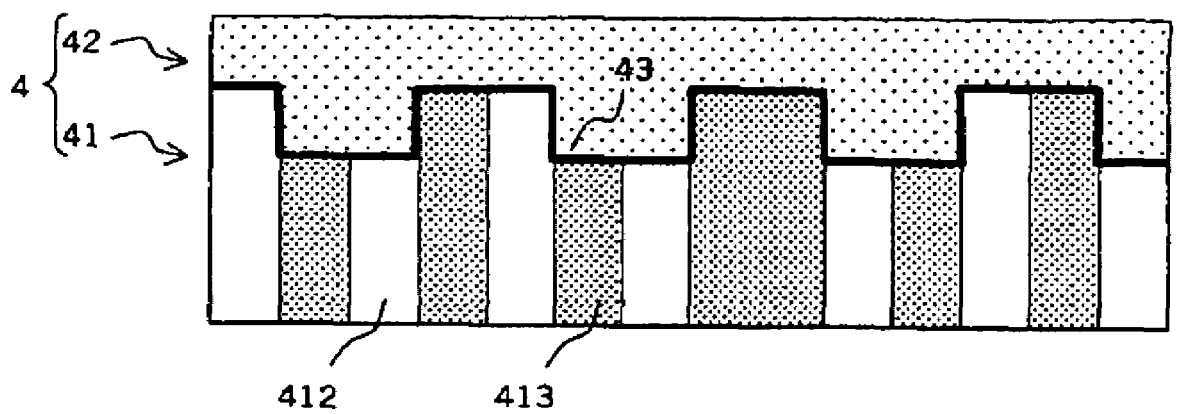
FIG. 18 represents a view in section of the grooved structure according to a particular embodiment according to the invention.
Figure 18:
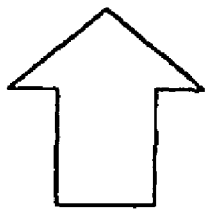

In a second embodiment, illustrated in FIG. 18, the layer 41 constituting the structure is made from a material composed of mutually parallel alternate layers 412, 413 of equal thickness and a central layer of double thickness corresponding to the defect, said layers alternately comprising a first material having a first permittivity and a second material having a second permittivity, the plane of the layers being perpendicular to the plane of the lower face and the profile of each groove along the axis perpendicular to the direction of the grooves being composed of regular crenellations with a pitch two times greater than the thickness of the alternate layers. This arrangement makes it possible to simplify considerably the profile of the upper face of the grating, which now comprises only two different heights. The incident beam is represented by a thick arrow in these two FIGS. 17 and 18.

Figure 19:
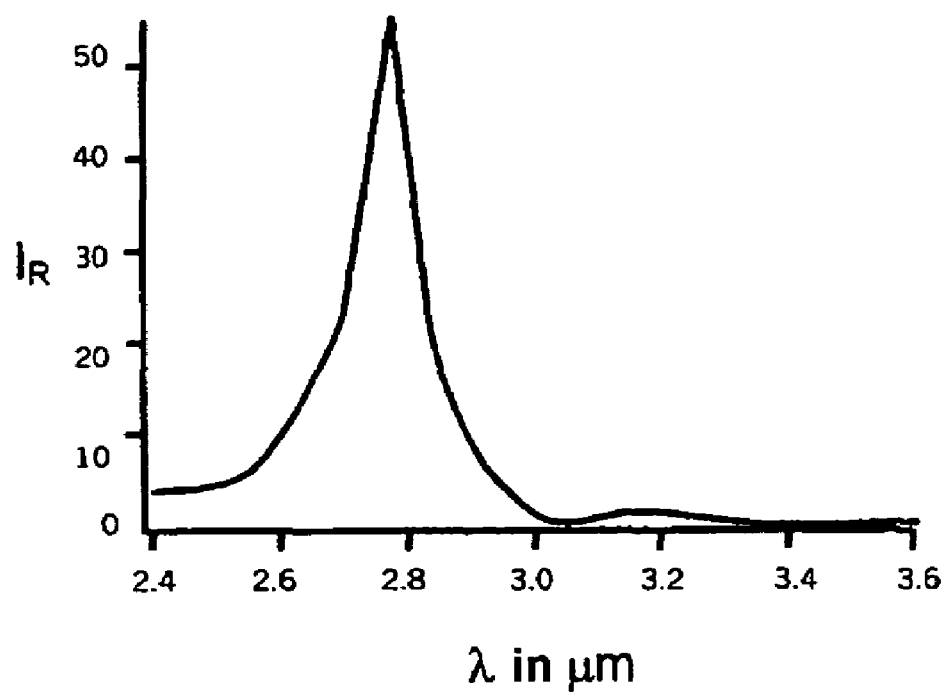
FIG. 19 represents the relative optical intensity as a function of the wavelength for a structure profile according to the first embodiment according to the invention.
Figure 20:
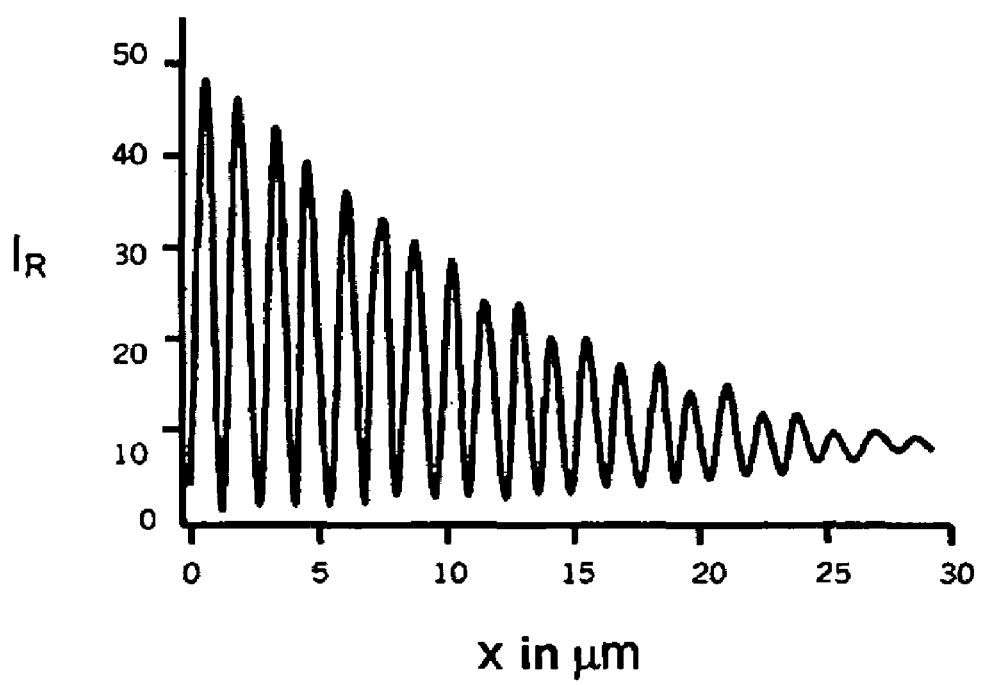
FIG. 20 represents the relative intensity as a function of the distance from the center of the structure according to the first embodiment.

For example, let there be a metallic structure of the same type as that represented in FIG. 17, its period Λ being 2.8 microns in air. The metal of the film which covers the structure is assumed to be perfect, i.e. it has an infinity permittivity. This structure is illuminated in normal incidence by a plane wave. The distribution of the near field excited by the structure is calculated by the method of finite elements. FIG. 20 represents the spatial distributions of the component of the average intensity of the electric field below the structure in a direction perpendicular to the median plane of the grating. The near field becomes very intense when the wavelength λ of the plane wave is close to Λ.n, which is a general property of reflective gratings. The near field is localized in the middle of the grating, corresponding to x being zero. At least 60 per cent of the energy of the near field is localized to within 10 microns of the middle of the structure, corresponding to an increase in the intensity of the field by a factor of 3 compared to a conventional periodic structure. FIG. 19 represents the spectral distributions of the component of the average intensity of the electric field below the grating as a function of the wavelength. The spectral Width at half-height of the intensity is equal to 0.14 micron.

Figure 21:
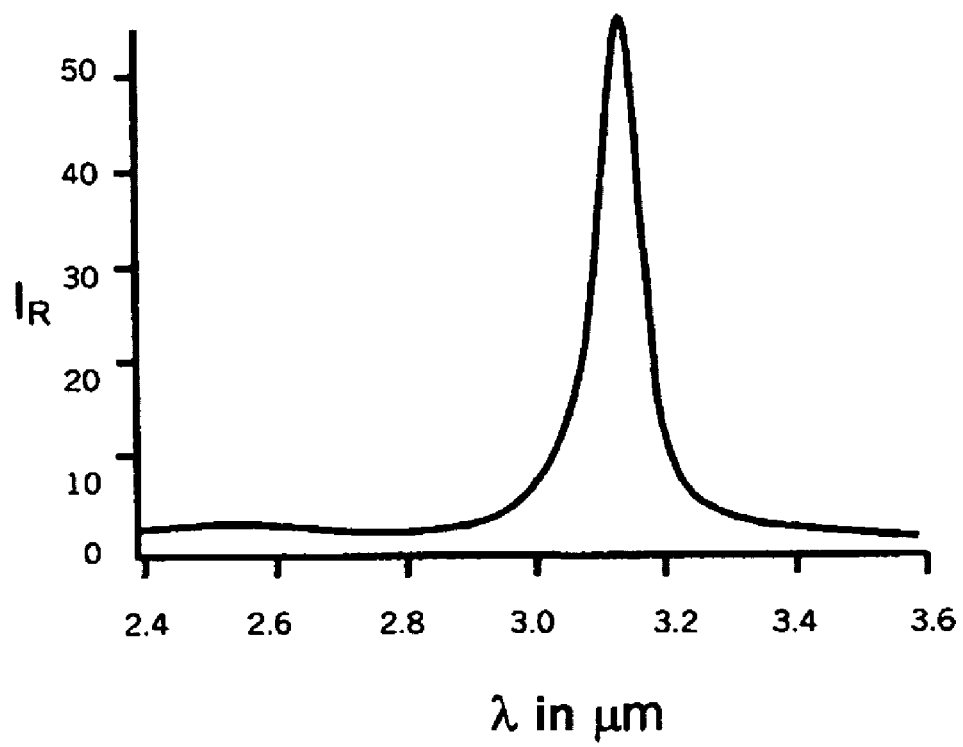
FIG. 21 represents the relative intensity as a function of the wavelength for a biperiodic Bragg grating profile.
Figure 22:
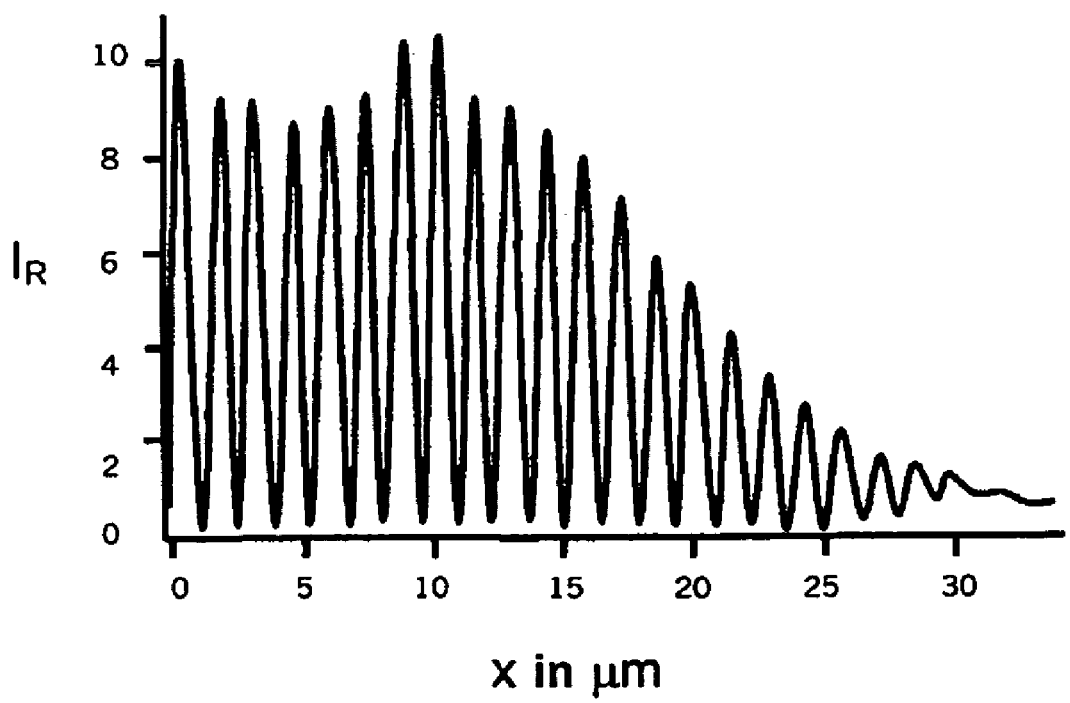
FIG. 22 represents the relative intensity as a function of the grating profile in FIG. 21.

It should be noted that when the structure does not comprise a central defect, this affects its confinement properties. For comparison, FIGS. 21 and 22 present similar distributions but in the case of localization due to effects of a finite size in the case of a biperiodic grating not having a central defect. There is spatial localization, but over a width two times greater than in the previous case. The spectral distribution furthermore narrows, the spectral width at a half-height of the intensity being equal to 0.12 micron as indicated in FIG. 21.

Case of Photodetectors with a Two-Dimensional Structure

Figure 23:
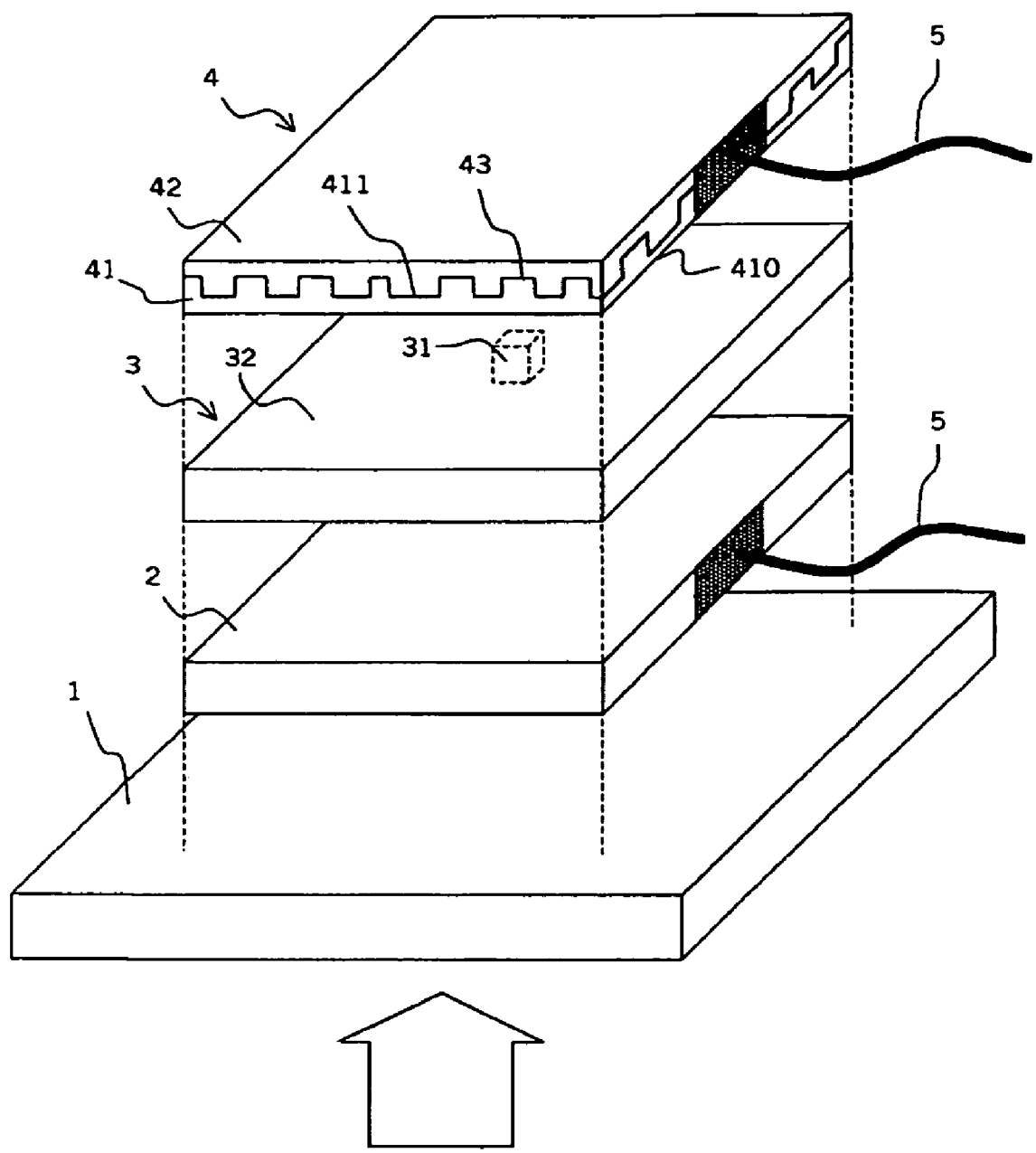
FIG. 23 represents an exploded view of a two-dimensional structure according to the invention.

In this case, as indicated in FIG. 23, a photodetector 10 according to the invention essentially comprises:

A first photodetector support substrate 1, which is transparent to the optical radiation intended to be detected;

A conductive first layer 2, which is likewise transparent;

A second layer 3 composed of the active zone 31 proper, which has the form of a central zone with small dimensions surrounded by a peripheral zone 32 which is inactive to light and arranged around the active zone, at least the inactive zones likewise being transparent;

The two-dimensional structure 4 according to the invention;

Electrical contact zones 5 making it possible to pick up the electrical signal coming from the active zone.

The two-dimensional structure is composed of patterns with substantially identical dimensions, the active zone 31 being centered on the structure and the dimensions of the active zone being substantially equal to the average dimensions of the patterns.

The structure is produced in a layer 41 of at least one dielectric material which is transparent in the spectral range of the optical radiation, said layer comprising a substantially plane lower face 410 in contact with the active zone and an upper face 411 comprising the patterns of the structure, said face being covered with a metal film 43, the optical thickness of said layer separating the lower face from the upper face varying:

along a first axis parallel to the plane of the lower face, as at least one first grating whose pitch has a first spatial frequency;

along a second axis perpendicular to the first axis and parallel to the plane of the lower face, as at least one second grating whose pitch has the same first spatial frequency; and along an oblique third optical axis at 45 degrees to the previous two, as at least one third grating whose pitch has a second spatial frequency equal to half the first spatial frequency.

The photodetector functions as follows. A light beam (thick arrow in FIG. 23) illuminates the photodetector with close to normal incidence. This beam passes through the first substrate 1, the conductive first layer 2 and the second layer 3 without substantial attenuation. It then reaches the two-dimensional structure 4. As mentioned, said structure is the combination of a coupling grating whose purpose is to excite a surface wave in transverse magnetic polarization, i.e. one whose electric field is perpendicular to the grating, with a Bragg grating having a defect in order to obtain localization of the light beam captured by the structure in a central zone 31 corresponding to the active zone. This improves the signal-to-noise ratio, which is the intended object.

Along the two mutually perpendicular axes Ox and Oy perpendicular to the plane of the lower face, the mathematical function defining the optical thickness of the structure is the sum of two periodic functions g(x, y) and f(x, y), f representing the coupling function with spatial period Λ and g representing the localization Bragg function with spatial period 2Λ comprising a central defect. The relative phase between f and g conditions the final confinement properties of the coupled wave. If λ denotes the average wavelength of the incident radiation, then the pitch Λ should advantageously be approximately equal to λ/2n in order to obtain optimal coupling of the incident wave.

The simplest periodic functions are the trigonometric sine and cosine functions. In this case, the functions may be defined in the following way:

$$f(x, y) = \pm a_1 \sin\left(\frac{2\pi}{\Lambda}(x-y)\right)$$

$$\text{and } g(x, y) = -a_2\left[\cos\left(\frac{4\pi}{\Lambda}|x| + \frac{\pi}{2}\right) + \cos\left(\frac{4\pi}{\Lambda}|y| \pm \frac{\pi}{2}\right)\right]$$

The constants $a_1$ and $a_2$ are positive, the + or − signs placed in front of $a_1$ being associated with two possible implementations of the structure. As mentioned for the one-dimensional structures, all functions $\tilde{f}$ and $\tilde{g}$ having the same spectral content as the functions f and g at the order 1/Λ and the order 2/Λ will have similar coupling and confinement characteristics.

Figure 24:
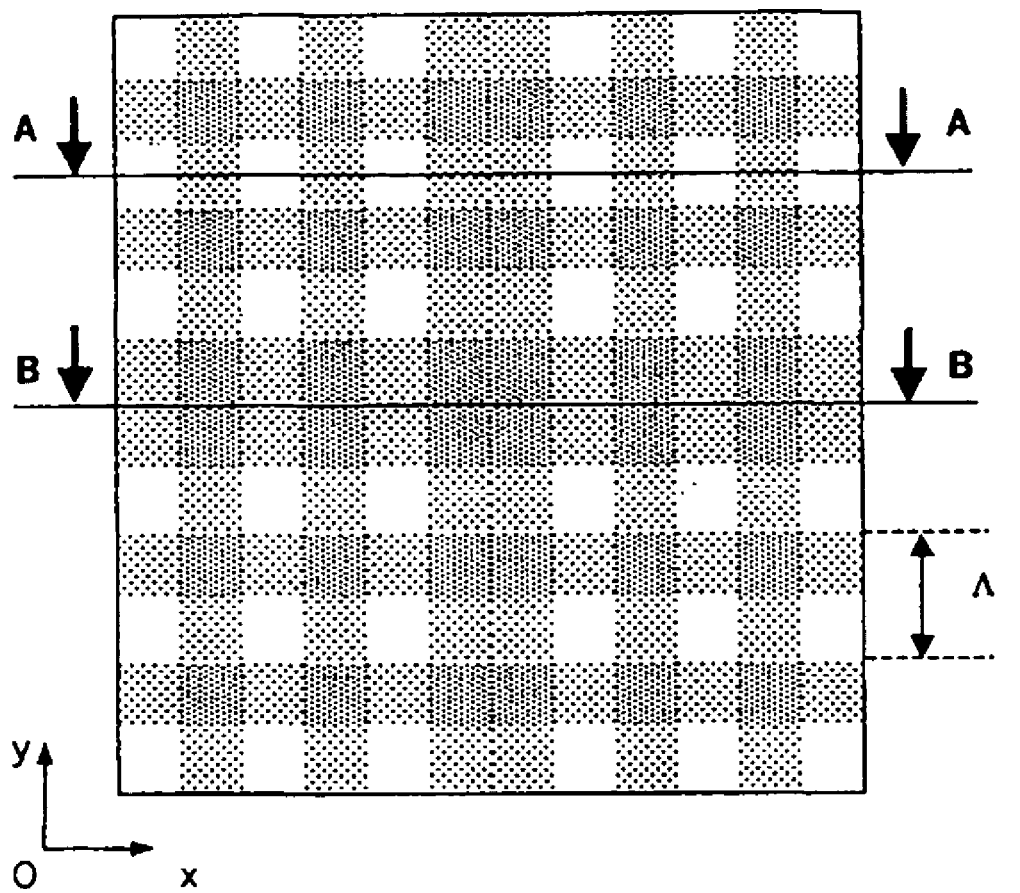
FIG. 24 represents a plan view and two views in section of a first function partly constituting a two-dimensional structure according to the invention.
Figure 24:
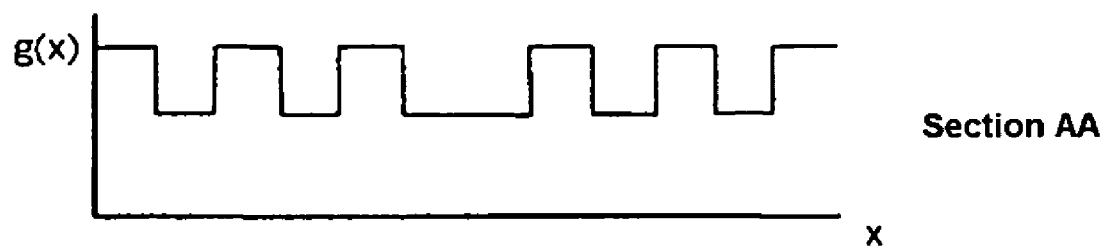
Figure 24:
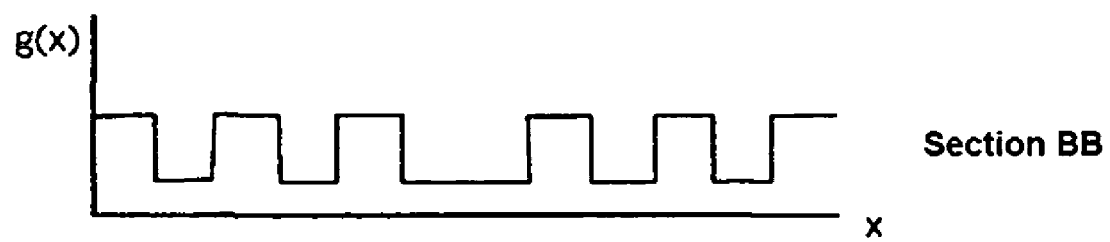
Figure 25:
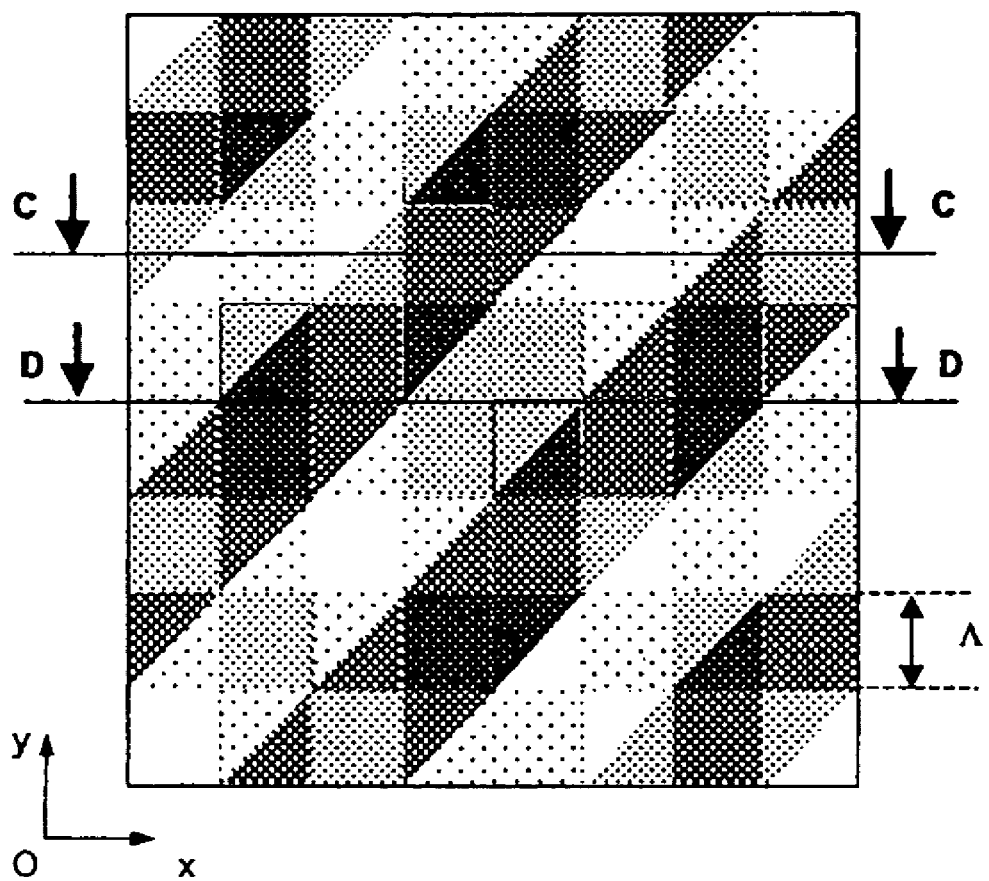
FIG. 25 represents a plan view and two views in section of the function constituting the two-dimensional structure according to the invention.
Figure 25:
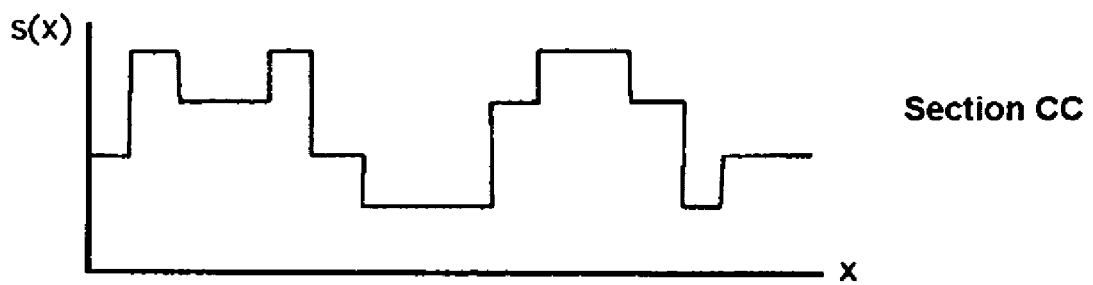
Figure 25:
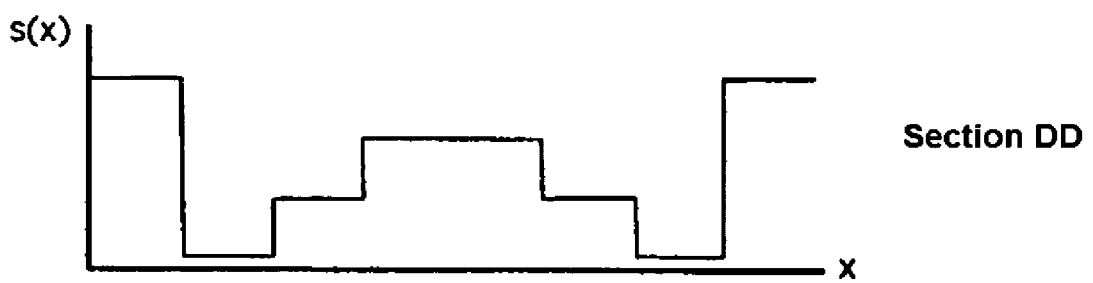

Technologically, the structures that are simple to produce consist of "staircase steps" or facets obtained by stacking successive layers. Mathematically, in order to obtain this type of profile s(x,y), the functions f and g may likewise be replaced by the functions sign(f) and sign(g). Thus, FIGS. 24 and 25 represent in plan view and the section views of the functions:

$$\tilde{g}(x, y) = -a_2\left[\text{sign}\left(\cos\left(\frac{4\pi}{\Lambda}|x| + \frac{\pi}{2}\right)\right) + \text{sign}\left(\cos\left(\frac{4\pi}{\Lambda}|y| + \frac{\pi}{2}\right)\right)\right]$$

$$\tilde{s}(x, y) = \tilde{f}(x, y) + \tilde{g}(x, y) = a_1\left[\text{sign}\left(\cos\left(\frac{2\pi}{\Lambda}(x-y)\right)\right)\right] + \tilde{g}(x, y),$$

In other words, the optical thickness of the structure separating the lower face from the upper face varies along two mutually perpendicular axes, which are parallel to the plane of the lower face and whose common origin is centered on the center of the structure, as a function which is the sum or the difference of:

a first function which is proportional to the sign function of a first cosine function of the absolute value of the distance from the origin proportional to the sign function of the cosine function first axis, said first cosine function being phase-shifted by plus or minus 90 degrees with respect to the origin;

a second function which is proportional to the sign function of the cosine function of the absolute value of the distance from the origin along the axis perpendicular to said first axis and has a period identical to that of the first function, said second cosine function being phase-shifted by plus or minus 90 degrees with respect to the origin;

a third function which is proportional to the sign function of the sine function of the difference between the distances to the origin along the first axis and the second axis.

In the plan view of the function $\bar{g}(x,y)$ as represented in FIG. 24, the level differences between the staircase steps are represented by gray levels becoming brighter as the level increases. The profile of the function along two sections AA and BB is represented below the plan view.

In the plan view of the function $\bar{s}(x,y)$ as represented in FIG. 25, the level differences between the staircase steps are represented by gray levels becoming brighter as the level increases. The profile of the function along two sections CC and BB is represented below the plan view.

This invention advantageously applies to detectors of the QWIP (Quantum Well Infrared Photodetector) type, the metallic structures according to the invention being applied above the active zone of these components. The active zone is placed as close as possible to the structure and in correspondence with the defect of said structure.

The invention also applies to other types of detectors, for example inter-band photodetectors or photoconductors based on families of materials such as GaSb (gallium antimonide) or HgCdTe (Mercury Cadmium Tellurium).

The active zone of the component should be limited to a small region above the defect. The limitation of the active zone may involve:
neutralizing the quantum wells by implantation;
limiting the current by neutralization of the doping in the contact layer, in the case of photodetector systems.

The structures according to the invention may be used in other spectral ranges, such as microwaves whose frequencies are of the order of one gigahertz, the far infrared range whose frequencies are of the order of one terahertz, or the near infrared range.

The invention also applies to photosensitive matrices comprising a plurality of photodetectors according to the invention organized in rows and columns.

The invention claimed is:

1. A photodetector comprising:
an active zone for detecting optical radiation; and
a structure arranged on said active zone, intended for optically coupling the optical radiation, said structure combining the properties of coupling gratings and Bragg gratings and having a defect which, from an incident wave, makes it possible to obtain a plasmon wave which is both coupled and localized in the active zone, said active zone having dimensions which are small compared to those of said structure,
wherein said active zone has an elongate share and said structure is composed of grooves which are mutually parallel and parallel to the length of the active zone;
wherein said structure is produced in a layer of at least one dielectric material which is transparent in the spectral range of the optical radiation, said layer comprising a substantially plane lower face in contact with the active zone and an upper face comprising the grooves of the structure, said face being covered with a metal film, and in that the optical thickness of said layer separating the lower face from the upper face along an axis (Ox) perpendicular to the direction of the grooves and parallel to the plane of the lower face varies as the superposition of a coupling grating whose pitch has a first spatial frequency and a second grating whose pitch has a second spatial frequency that is two times the first spatial frequency and which has a central spatial defect.

2. The photodetector as claimed in claim 1, wherein the layer constituting the structure is made from an isotropic dielectric material, and the profile of each groove along the axis perpendicular to the direction of the grooves is composed of mutually parallel plane facets with different heights.

3. The photodetector as claimed in claim 1, wherein the layer constituting the structure is made from a material composed of mutually parallel alternate layers of equal thickness and a central layer of double thickness, said layers alternately comprising a first material having a first permittivity and a second material having a second permittivity, the plane of the layers being perpendicular to the plane of the lower face, and in that the profile of each groove along the axis perpendicular to the direction of the grooves is composed of regular crenellations with a pitch two times greater than the thickness of the alternate layers.

4. The photodetector as claimed in claim 1, wherein the optical thickness of said layer separating the lower face from the upper face varies along an axis (Ox) perpendicular to the direction of the grooves and parallel to the plane of the lower face, whose origin is centered on the center of the grating, as a function which is the sum or the difference of:
- a first function which is proportional to the sign function of the cosine function of the distance from the origin of said axis and has a period equal to that of the pitch of the grooves; and
- a second function which is proportional to the sign function of the cosine function of the absolute value of the distance from the origin of said axis and has a period equal to half that of the pitch of the grooves, said second function being phase-shifted by one half-period with respect to the first function.

5. The photodetector as claimed in claim 1, wherein the optical thickness of said layer separating the lower face from the upper face varies along an axis (Ox) perpendicular to the direction of the grooves and parallel to the plane of the lower face, whose origin is centered on the center of the grating, as a function which is the sum or the difference of:
- a first function which is proportional to the sign function of the sine function of the distance from the origin of said axis and has a period equal to that of the pitch of the grooves; and
- a second function which is proportional to the sign function of the cosine function of the absolute value of the distance from the origin of said axis and has a period equal to half that of the pitch of the grooves, said second function being phase-shifted by one half-period with respect to the first function.

6. The photodetector as claimed in claim 4, wherein the proportionality coefficient of the first function is two times that of the second function.

7. The photodetector as claimed in claim 1, wherein the pitch of the first grating of the structure is approximately equal to half the average wavelength of the incident radiation divided by the average optical index of the structure.

8. The photodetector as claimed in claim 1, wherein that said two-dimensional structure is composed of patterns with substantially identical dimensions, in that the active zone is centered on said structure and in that the dimensions of the active zone are substantially equal to the average dimensions of the patterns.

9. The photodetector as claimed in claim 8, wherein the structure is produced in a layer of at least one dielectric material which is transparent in the spectral range of the optical radiation, said layer comprising a substantially plane lower face in contact with the active zone and an upper face comprising the patterns of the structure, said face being covered with a metal film, the optical thickness of said layer separating the lower face from the upper face varying:
- along a first axis parallel to the plane of the lower face, as at least one first grating whose pitch has a first spatial frequency;
- along a second axis perpendicular to the first axis and parallel to the plane of the lower face, as at least one second grating whose pitch has the same first spatial frequency; and
- along an oblique third optical axis at 45 degrees to the previous two, as at least one third grating whose pitch has a second spatial frequency equal to half the first spatial frequency.

10. The photodetector as claimed in claim 9, wherein, when the layer constituting the structure is made from an isotropic dielectric material, each pattern is composed of mutually parallel plane facets with different heights.

11. The photodetector as claimed in claim 10, wherein the optical thickness of said structure separating the lower face from the upper face varies along two mutually perpendicular axes, which are parallel to the plane of the lower face and whose common origin is centered on the center of the structure, as a function which is the sum or the difference of:
- a first function which is proportional to the sign function of a first cosine function of the absolute value of the distance from the origin proportional to the sign function of the cosine function first axis, said first cosine function being phase-shifted by plus or minus 90 degrees with respect to the origin;
- a second function which is proportional to the sign function of the cosine function of the absolute value of the distance from the origin along the axis perpendicular to said first axis and has a period identical to that of the first function, said second cosine function being phase-shifted by plus or minus 90 degrees with respect to the origin;
- a third function which is proportional to the sign function of the sine function of the difference between the distances to the origin along the first axis and the second axis.

12. The photodetector as claimed in claim 8, wherein the dimensions of the patterns of the structure are approximately equal to half the average wavelength of the incident radiation divided by the average optical index of the structure.

13. The photodetector as claimed in claim 1, wherein the active zone is surrounded by an optically passive zone with dimensions substantially equal to those of the structure.

14. The photodetector as claimed in claim 13, wherein the active zone is a quantum well structure.

15. A photosensitive matrix comprising a plurality of photodetectors organized in rows and columns, wherein that said photodetectors are as claimed in one of the preceding claims.

16. The photodetector as claimed in claim 5, wherein the proportionality coefficient of the first function is two times that of the second function.

* * * * *